United States Patent [19]
Lin

[11] Patent Number: 6,048,650
[45] Date of Patent: Apr. 11, 2000

[54] HALF TONE PHASE SHIFT MASK COMPRISING SECOND PATTERN LAYER ON BACKSIDE OF SUBSTRATE

[75] Inventor: Benjamin Szu-Min Lin, Chiayi, Taiwan

[73] Assignee: United Microelectronics Corp., Taiwan

[21] Appl. No.: 09/139,487

[22] Filed: Aug. 25, 1998

[30] Foreign Application Priority Data

Jun. 25, 1998 [TW] Taiwan ................................. 87110294

[51] Int. Cl.[7] ........................................................ G03F 9/00
[52] U.S. Cl. .................................................. 430/5; 430/22
[58] Field of Search .......................... 430/5, 22; 356/401, 356/399

[56] References Cited

U.S. PATENT DOCUMENTS 5,387,484  2/1995  Doany et al. ................. 430/5
5,929,997  7/1997  Lin ............................ 356/401

Primary Examiner—S. Rosasco
Attorney, Agent, or Firm—Thomas, Kayden, Horstemeyer & Risley, LLP

[57] ABSTRACT

A half-tone phase shifting mask (HTPSM) with a back surface blind border alignment mark includes a shifter layer with a desired pattern on one surface of a transparent substrate, and a light shielding layer with a mark opening on another surface of the transparent substrate. In this case, the light ray passing through the mark opening is partially shielded by the shifter layer so that there is no light amplitude subtraction within the mark opening.

19 Claims, 5 Drawing Sheets

HALF TONE PHASE SHIFT MASK COMPRISING SECOND PATTERN LAYER ON BACKSIDE OF SUBSTRATE

CROSS-REFERENCE TO RELATED APPLICATION

This application claims the priority benefit of Taiwan application Ser. No. 87110294, filed Jun. 25, 1998, the full disclosure of which is incorporated herein by reference.

BACKGROUND OF THE INVENTION

1. Field of the Invention

This invention relates to a photolithography process, and more particularly to a method of fabricating a phase shifting mask (PSM).

2. Description of Related Art

As the integration of an integrated circuit (IC) device increases, a photolithography technology with high light resolution is required to achieve precise fabrication of the IC device. A light source with shorter wavelength is proposed as a way of meeting this high light resolution requirement. A krypton fluoride laser is an example of an ultraviolet source with a wavelength of 2480 Å for exposure use. However, although a light source with shorter wavelength can increase the light resolution, it can also cause its resulting depth of focus (DOF) to be insufficient. Another way to increase light resolution is to use a PSM in the photolithography process. The use of PSMs has become a trend, and so manufacturers endeavor to devote more effort to the R&D of PSMs.

The PSM uses a shifter layer formed over a typical photo-mask, in which the shifter layer can invert the phase of a light ray. When the PSM is exposed, the light rays passing through the shifter layer with inverted phase interfere with the other light rays so that the patterns exposed on a semiconductor wafer have a better pattern resolution. The PSM has an advantage in that there is no need of a new light source to increase the pattern resolution through a modification on the typical photo mask, even though the fabrication of the PSM may be complicated.

A half tone PSM (HTPSM) is usually used to form a hole pattern in photolithography technology. Because a positive photoresist is generally used to form the hole pattern mask, conventional HTPSM entails a shifter layer with the hole pattern formed over a transparent substrate. The shifter layer usually has a transmission coefficient of only about 3–10% and can shift the phase of passing light with a shift angle of 180°, which means that the phase of the passing light is inverted. Due to the shifter layer, as seen in FIG. 1, the light contrast between the openings 110, 112 and the shifter layer 102 is increased and the pattern resolution is thereby increased.

FIG. 1 is a bottom view of a schematic conventional HTPSM. FIG. 2 is a cross-sectional view of the schematic conventional HTPSM along the line of I—I in FIG. 1. Referring to FIG. 1 and FIG. 2, a conventional HTPSM includes a transparent substrate 100 with a shifter layer 102 on it. The transparent substrate 100 includes a transparent material such as quartz, and the shifter layer 102 includes a material such as $MoSi_2O_xN_y$, or $SiO_xN_y$. An opening 110 and an opening 120 are formed on the shifter layer 102 to expose the transparent substrate 100. In a photolithography process, when the light rays pass through the HTPSM, the opening 110 is for forming a hole pattern, and the opening 120 is for forming an alignment mark such as a reticle alignment mark (not shown), which is used for alignment in several subsequent fabrication processes.

FIG. 3 is the light amplitude distribution on an exposed wafer along the line I—I in FIG. 1. As seen in FIG. 2 and FIG. 3, the shifter layer 102 shifts the light phase with a shift angle of 180° and has a transmission coefficient of about 3–10% under an exposure of an i-line ray with a wave length of 365 nm or a deep ultra-violet (UV) ray with a wave length of 248 nm. The positive light amplitude distribution is from the light passing through the openings 110, 120, and the negative light amplitude distribution is from the light passing through the shifter layer 102. A light intensity is obtained by taking the square of the summation of the positive amplitude and the negative amplitude. The light intensity distribution on the wafer (not shown) can be expected to have a better pattern resolution due to a subtraction of the negative amplitude on several critical places. The critical places are located on the edges of the opening 110, 120 on the shifter layer 102 due to the abrupt change of the light phase.

Even though the shifter layer 102 can improve the pattern resolution, it causes a serious issue regarding the question of mask alignment. Conventionally, a red-light laser with a length of 488 nm or a light emission diode (LED) with a wavelength of 633 nm is used to align the photo mask. These two kinds of light have a larger transmission coeffcient of greater than 50% on the shifter layer 102. FIG. 4 is the light amplitude distribution on an exposed wafer along the line I—I in FIG. 1, in which the light source is for the purpose of aligning the photo mask. In FIG. 4, the positive light amplitudes are from the light ray passing through the openings 110 and 112, and the negative light amplitudes are due to the light rays passing through the shifter layer 102. After taking the square of the summation of the positive amplitude and the negative amplitude and automatically amplifying the light amplitude through an auto-gain device, the light contrast (not shown) for the opening 120 is critically poor.

The poor light contrast of the opening 120 results in a difficulty in mask alignment, and even may result in a failure of mask alignment. This is a drawback of the conventional HTPSM.

SUMMARY OF THE INVENTION

It is therefore an objective of the present invention to provide a half-tone PSM with a back surface mark pattern to solve the alignment issues. The back surface mark pattern increases a mark signal contrast to make ia precise mask alignment process be easier.

In accordance with the foregoing and other objectives of the present invention, the half-tone PSM with a back surface mark pattern includes a transparent substrate with a front surface and a back surface. A fabrication pattern is formed over the transparent substrate on the front surface for subsequent fabrication process. A mark pattern is formed on the back surface at the border of the transparent substrate for mask alignment. The fabrication pattern, including a material such as $MoSi_2O_xN_y$ or $SiO_xN_y$, can shift the light phase of passing light with a shift angle of 180° and has a transmission coefficient of about 50% when exposed in a light source for mask alignment, such as a red-light laser with a length of 488 nm or a light emission diode (LED) with a wave length of 633 nm. The mark pattern includes a metal material such as chromium, which can fully shield the passing light. After an automatic signal amplification by an auto-gain device, the light intensity contrast of the mark pattern is significantly improved so that mask alignment can be precisely performed.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

A half-tone PSM (HTPSM) with a back surface blind border alignment mark in the invention is fabricated on a transparent substrate over a first surface called a back surface and a second surface called a front surface.

Figure 5A:
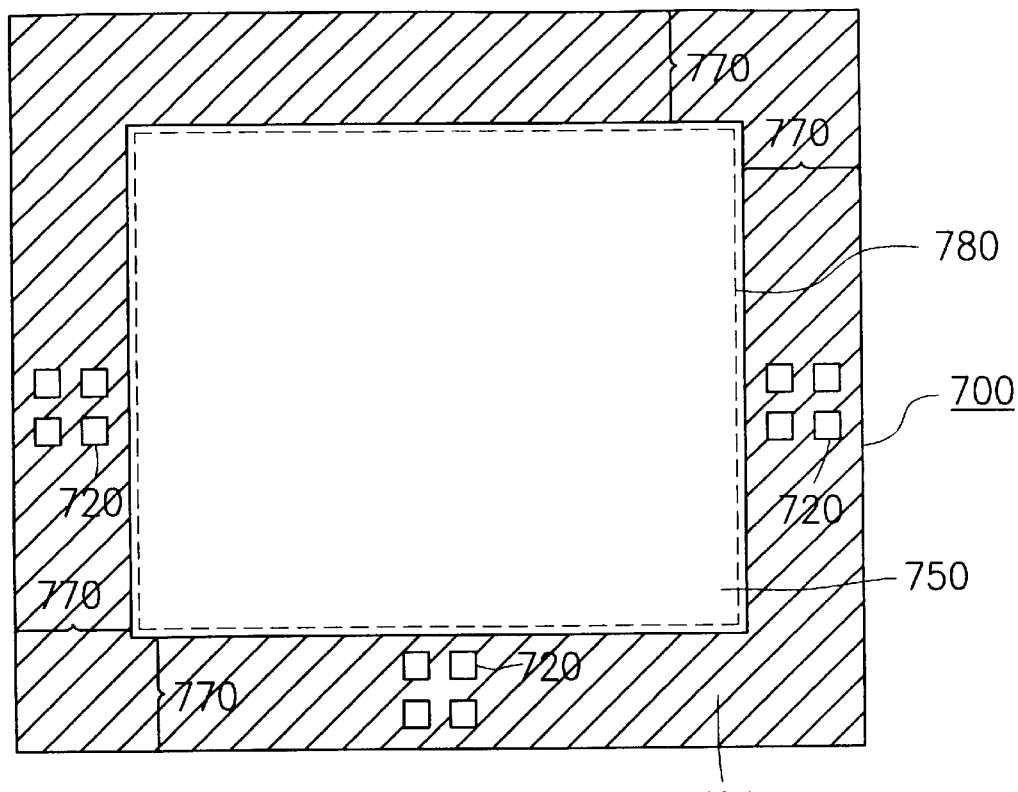
FIG. 5A is a view from the back surface of a schematic HTPSM, according to a preferred embodiment of the invention.
Figure 5B:
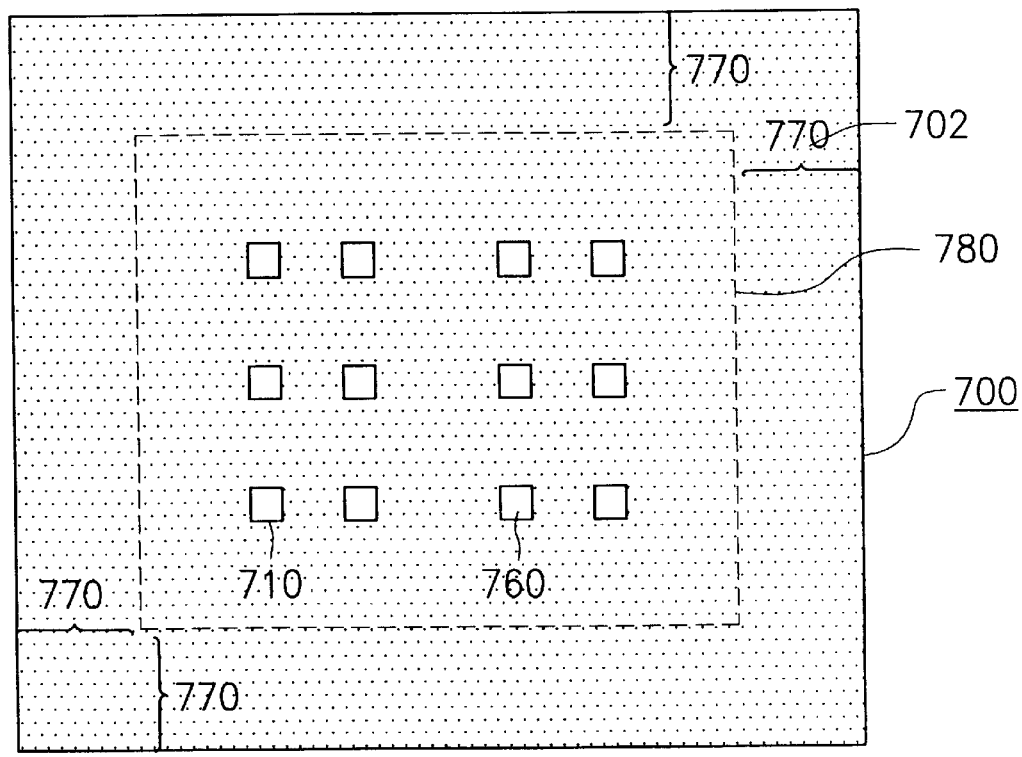
FIG. 5B is a view from the front surface of a schematic HTPSM, according to a preferred embodiment of the invention.

FIG. 5A is a schematic view from the back surface of a HTPSM, according to a preferred embodiment of the invention. FIG. 5B is a schematic view from the front surface of a HTPSM, according to a preferred embodiment of the invention. In FIG. 5A, the transparent substrate 700, including a transparent material such as quartz or glass, is divided into an inner region 780 within a dashed box region and a shaded border region 770. The border region 770 is used for forming mark patterns and the inner region 780 is used for forming fabrication pattern. A light shielding layer 704 including a typical light shielding material, such as Chromium or metal, is formed on the back surface 750 within the border region 770. A mark opening 720 on the light shielding layer 704 exposes the back surface 750 of the transparent substrate 700. The mark opening 720 is for mask alignment, and includes a reticle alignment mark. In order to reduce the light reflection of the light shielding layer 704, an anti-reflection layer (not shown) is usually coated on the light-shielding layer 704 to avoid an affecting the light resolution.

In FIG. 5B, a shifter layer 702 is formed over the transparent substrate 700 on the front surface 760. A hole opening 710 is formed on the shifter layer 702 within the inner region 780 to expose the front surface 760. The shifter layer 702 is, for example, a type of positive photoresist and shifts the light phase of the passing light with a shift angle of 180° as described before. The shifter layer 702 can also be designed in a negative type but in the preferred embodiment a positive type is shown. The material used is, for example, $MoSi_zO_xN_y$ or $SiO_xN_y$. The transmission coefficient is about 3–10% for exposing light.

Figure 6:
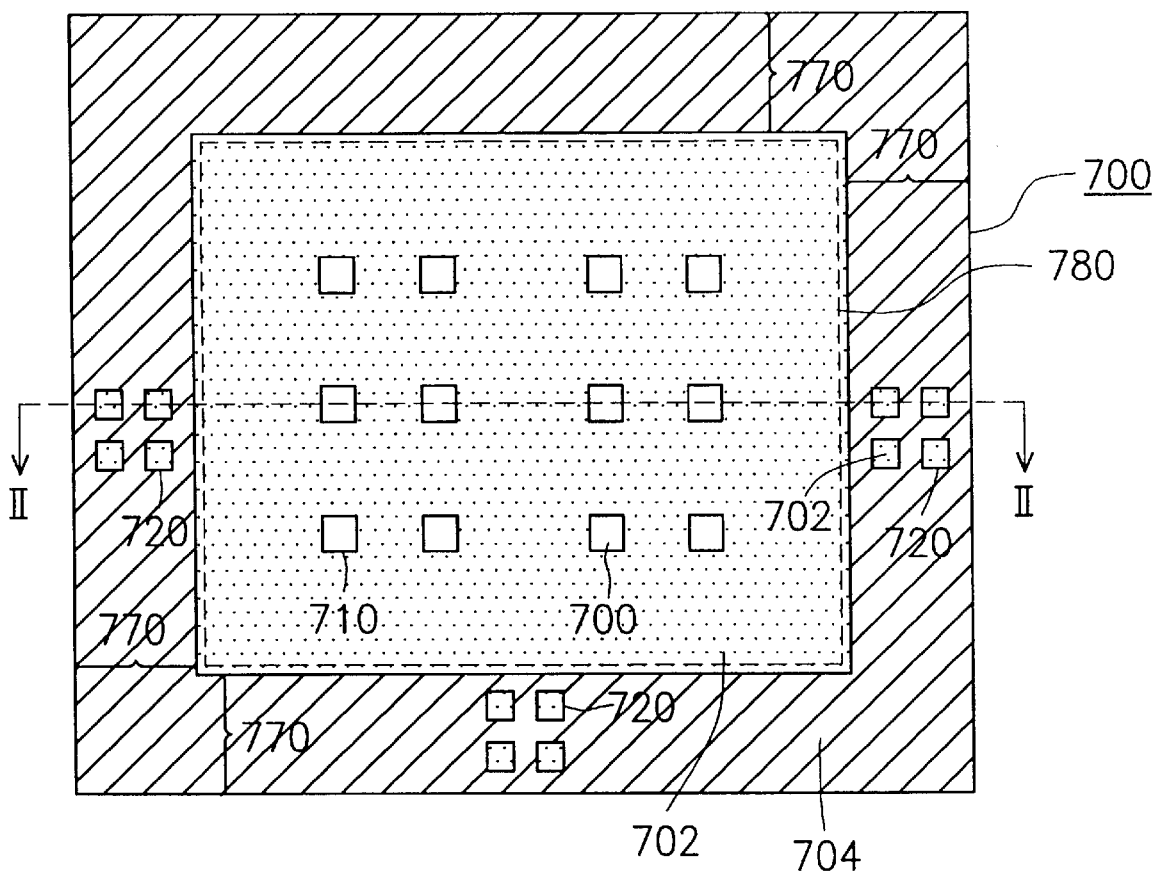
FIG. 6 is a top view from the back surface after overlapping the FIG. 5A and the FIG. 5B.

FIG. 6 is a top view from the back surface 704 after overlaying FIG. 5A on FIG. 5B. In FIG. 6, the shifter layer 702 under the border region 770 cannot be seen except in the region within the mark opening 720. The light shielding layer 704 shield all light rays, the hole opening 710 allows full light transmission, and the exposed region of the shifter layer 702 within the inner region 780 and the mark opening 720 allows partial light transmission and inverts the light phase.

Figure 7:
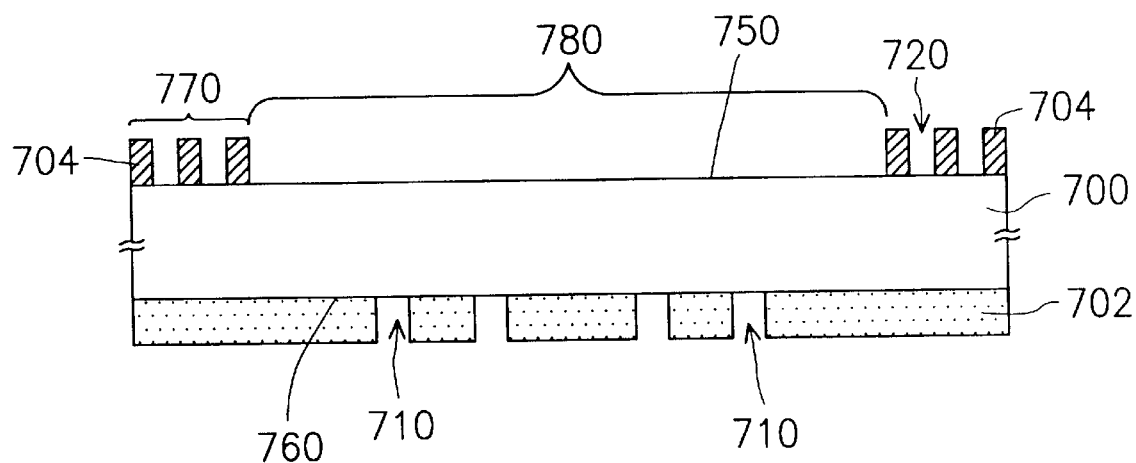
FIG. 7 is a cross-sectional view of the schematic HTPSM along the line of II—II in FIG. 6.
Figure 8:
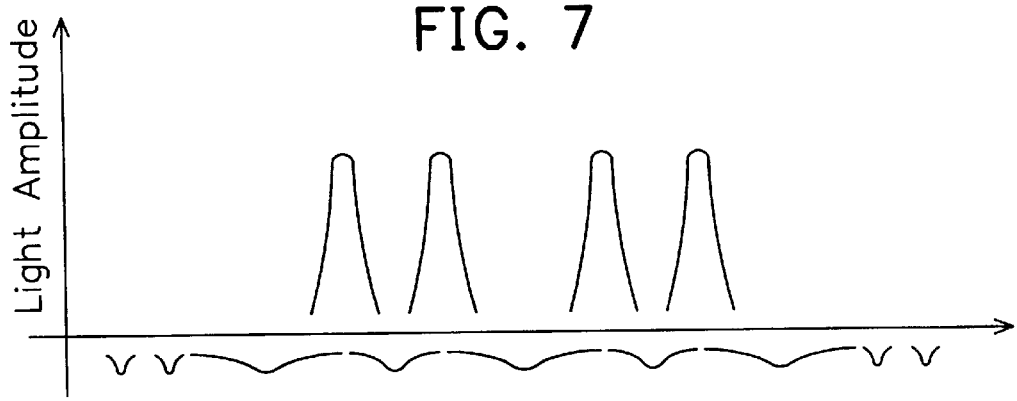
FIG. 8 is the light amplitude distribution on an exposed wafer along the line II—II in FIG. 6.
Figure 9:
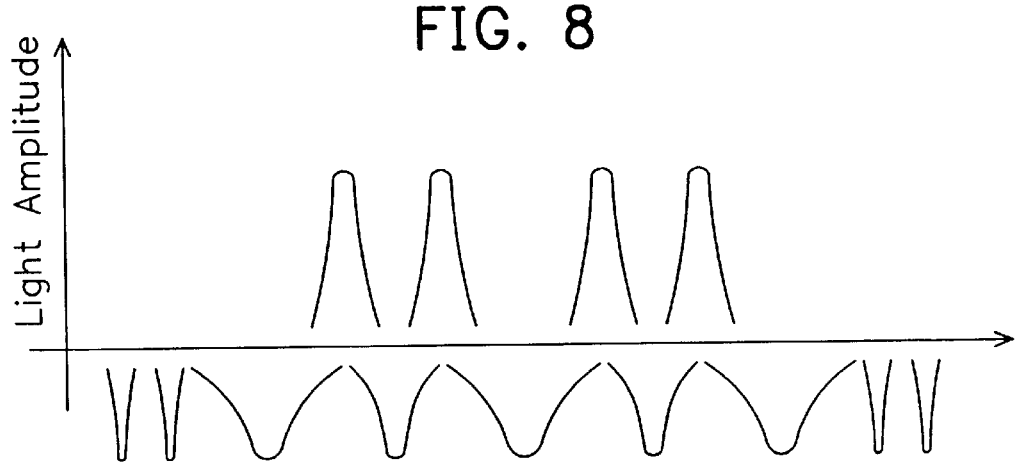
FIG. 9 is the light amplitude distribution on an exposed wafer along the line II—II in FIG. 6, in which the light source is for aligning the photo mask.

FIG. 7 is a cross-sectional view of the schematic HTPSM along the line II—II in FIG. 6. FIG. 8 is the light amplitude distribution on an exposed wafer along the line II—II in FIG. 6. FIG. 9 is the light amplitude distribution on an exposed wafer along the line II—II in FIG. 6, in which the light source is for aligning the photo mask.

In FIG. 7, the light shielding layer 704 with the mark opening 720 within the border region 770 is on the back surface 750 of the transparent substrate 700. The shifter layer 702 with the hole opening 710 is on the front surface 760 of the transparent substrate 700. The light rays are incident on the back surface and pass through the HTPSM of the invention to the semiconductor wafer (not shown).

Figure 1:
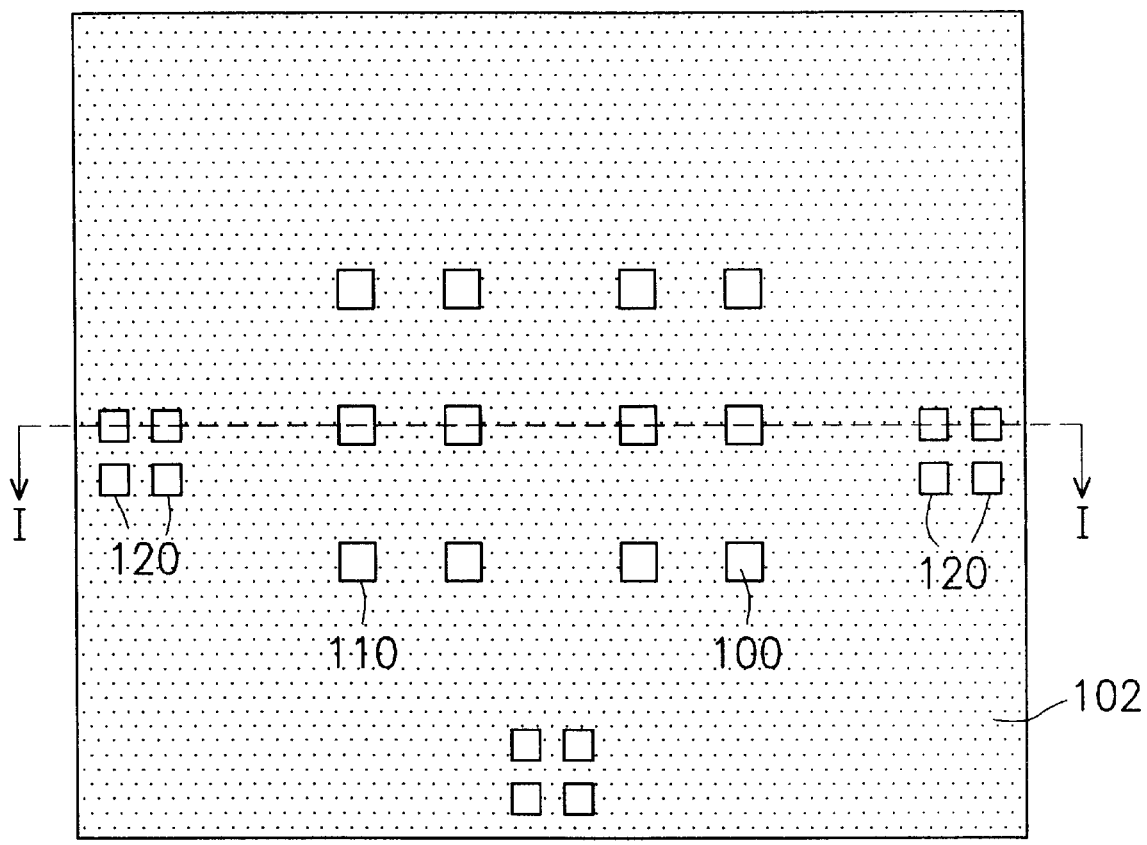
FIG. 1 is a bottom view of a schematic conventional HTPSM.
Figure 2:
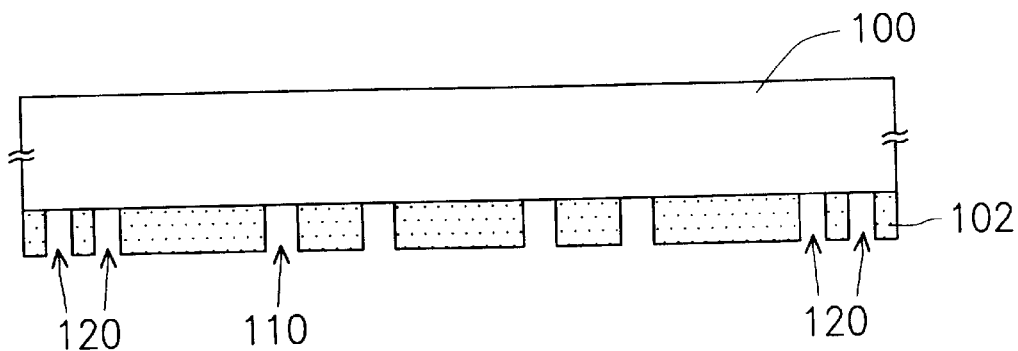
FIG. 2 is a cross-sectional view of the schematic conventional HTPSM along the line 1—1 in FIG. 1.
Figure 3:
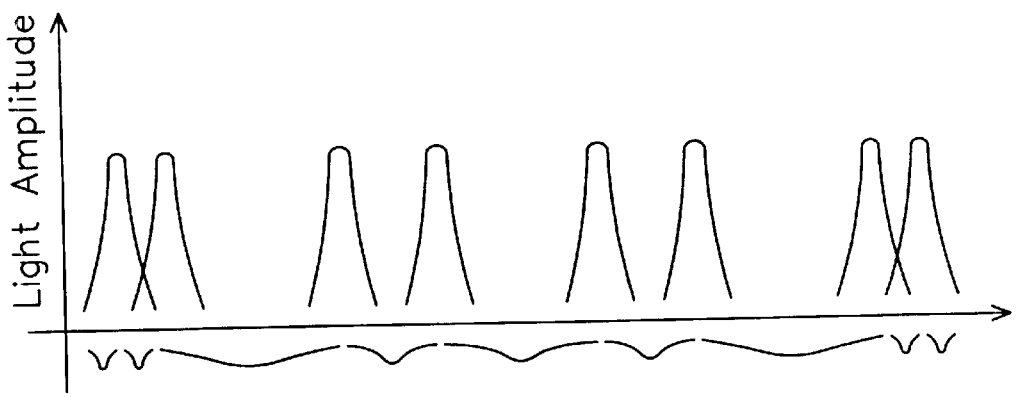
FIG. 3 is the light amplitude distribution on an exposed wafer along the line I—I in FIG. 1.

Referring to FIG. 7 and FIG. 8, when the HTPSM of the invention is exposed to the light source used in the photo-lithography process as described in FIG. 3, the light amplitude distribution within the inner region 750 is as strong as usual. The quality of the fabrication pattern is maintained without deterioration.

Figure 4:
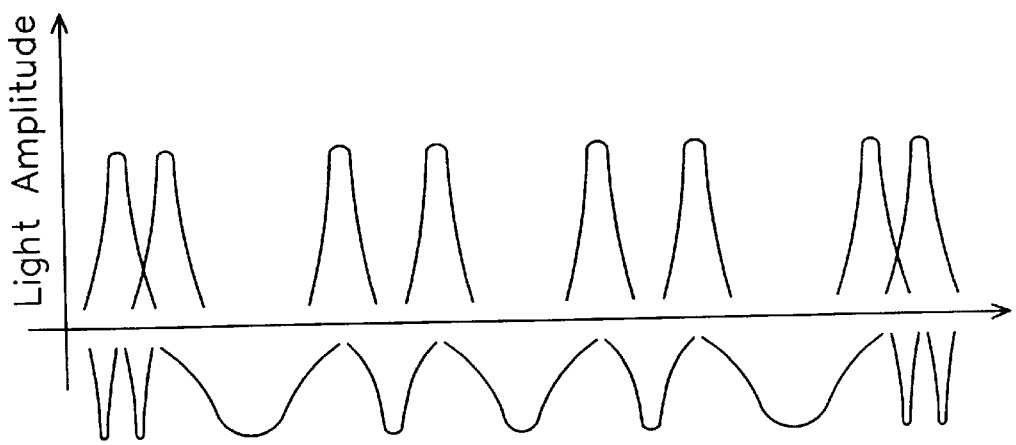
FIG. 4 is the light amplitude distribution on an exposed wafer along the line I—I in FIG. 1, in which the light source is for aligning the photo mask.

Referring to FIG. 7 and FIG. 8, when the HTPSM of the invention is exposed to the light source used for mask alignment, a light intensity contrast within the border region 770 is much stronger than the conventional one shown in FIG. 4. The light intensity is obtained by taking the square of the summation of the positive amplitude and the negative amplitude. The shifter layer 702 performs as usual but the light shielding layer 704 shields the light in places other than the mark opening 720. Since the light rays in the border region 770 are either fully or partially shielded, the positive amplitude is zero. Due to the zero positive amplitude, there is no subtraction on the light amplitude to deteriorate the light intensity in the border region 770. The light intensity contrast of the mark opening 720 is stronger than that of the conventional one. The light sources for mask alignment are, for example, a red-light laser with a length of 488 nm or a light emission diode (LED) with a wave length of 633 nm, which have a light transmission coefficient of about 50%. The auto-gain device is also used to amplify the light intensity. The strong light intensity contrast of the mark opening 720 allows mask alignment to be easily and precisely performed.

In conclusion, the HTPSM of the invention includes the back surface mark pattern, which is accomplished by the light shielding layer 704 on the back surface 750 with the mark opening 720. The mark opening 720 is for mask alignment. On the front surface 760, the shifter layer 702 is formed with the hole opening 710, which is for fabrication use. The light shielding layer 704 can fully shield the passing light, and the shifter layer 702 allows a transmission coefficient of about 50% while exposed to a light source for mask alignment and shifts the light phase with a shift angle of 180°. Therefore, the HTPSM in the invention has a strong light intensity contrast on the mark opening 720, and eases the mask alignment process.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A phase shifting mask (PSM) comprising:
    a transparent substrate, which has a first surface and a second surface;
    a first pattern layer on the first surface of the transparent substrate, wherein the first pattern layer exposes a portion of the first surface to form a mark pattern for aligning the PSM; and
    a second pattern layer on the second surface of the transparent substrate, wherein the second pattern layer exposes a portion of the second surface to form a hole pattern for fabrication use, and covers the mark pattern so that a light ray passing through the mark pattern is also masked by the second pattern layer.

2. The PSM of claim 1, wherein the transparent substrate comprises quartz.

3. The PSM of claim 1, wherein the transparent substrate comprises glass.

4. The PSM of claim 1, wherein the first pattern layer comprises a material to shield light.

5. The PSM of claim 4, wherein the first pattern layer comprises chromium.

6. The PSM of claim 1, wherein the second pattern layer comprises a material, which can shift a light phase.

7. The PSM of claim 6, wherein the second pattern layer shifts a light phase with a shift angle of 180°.

8. The PSM of claim 7, wherein the second pattern layer comprises a transmission, coefficient of about 3–10% while performing a pattern transformation of the second pattern, and a transmission coefficient of about 50% while performing a PSM alignment process.

9. The PSM of claim 6, wherein the second pattern layer comprises $MoSi_zO_xN_y$.

10. The PSM of claim 6, wherein the second pattern layer comprises $SiO_xN_y$.

11. The PSM of claim 1, wherein the mark pattern comprises a reticle alignment mark.

12. A phase shifting mask (PSM) comprising:
    a transparent substrate, which has a first surface and a second surface;
    a light shielding layer on the first surface of the transparent substrate, wherein the first pattern layer exposes a portion of the first surface to form a mark pattern for aligning the PSM; and
    a shifter layer on the second surface of the transparent substrate, wherein the second pattern layer exposes a portion of the second surface to form a hole pattern for fabrication use.

13. The PSM of claim 12, wherein the transparent substrate comprises quartz.

14. The PSM of claim 12, wherein the light shielding layer comprises chromium.

15. The PSM of claim 12, wherein the shifter layer shifts a light phase with a shift angle of 180°.

16. The PSM of claim 15, wherein the shifter layer comprises a transmission coefficient of about 3–10% while performing a pattern transformation of the second pattern, and a transmission coefficient of about 50% while performing a PSM alignment process.

17. The PSM of claim 15, wherein the second pattern layer comprises $MoSi_zO_xN_y$.

18. The PSM of claim 14, wherein the second pattern layer comprises $SiO_xN_y$.

19. The PSM of claim 12, wherein the mark pattern comprises a reticle alignment mark.

* * * * *